United States Patent
Ching et al.

(10) Patent No.: US 7,276,454 B2
(45) Date of Patent: Oct. 2, 2007

(54) APPLICATION OF IMPRESSED-CURRENT CATHODIC PROTECTION TO PREVENT METAL CORROSION AND OXIDATION

(75) Inventors: Kai-Ming Ching, Taiping (TW); Chia Fu Lin, Hsinchu (TW); Wen-Hsiang Tseng, Hsinchu (TW); Ta-Min Lin, Fangliao Township, Pingtung County (TW); Yen-Ming Chen, Jhubei (TW); Hsin-Hui Lee, Kaohsiung (TW); Chao-Yuan Su, Baoshan Township, Hsinchu County (TW); Li-Chih Chen, Danshuei Township, Taipei County (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 677 days.

(21) Appl. No.: 10/286,626

(22) Filed: Nov. 2, 2002

(65) Prior Publication Data

US 2004/0087175 A1  May 6, 2004

(51) Int. Cl.
*H01L 21/302* (2006.01)

(52) U.S. Cl. ...................... 438/745; 438/745
(58) Field of Classification Search ............... 438/745, 438/753, 754, 756; 134/1.3, 2, 3; 430/329, 430/331
See application file for complete search history.

(56) References Cited

U.S. PATENT DOCUMENTS

| | | | |
|---|---|---|---|
| 3,980,587 A * | 9/1976 | Sullivan ....................... 134/42 |
| 5,336,371 A | 8/1994 | Chung et al. ............ 156/659.1 |
| 5,503,962 A * | 4/1996 | Caldwell ..................... 430/317 |
| 5,705,320 A * | 1/1998 | Hsu et al. .................... 430/313 |
| 5,858,854 A * | 1/1999 | Tsai et al. .................... 438/401 |
| 6,037,671 A * | 3/2000 | Kepler et al. ................ 257/797 |
| 6,209,551 B1 | 4/2001 | Yang et al. .................. 134/1.2 |
| 6,274,504 B2 | 8/2001 | Sanderfer et al. ........... 438/745 |
| 6,440,647 B1* | 8/2002 | Yakobson .................... 430/329 |
| 6,524,965 B2* | 2/2003 | Chen ............................ 438/746 |
| 6,585,825 B1* | 7/2003 | Skee ............................. 134/3 |
| 2003/0092257 A1* | 5/2003 | Cheng ......................... 438/633 |

* cited by examiner

*Primary Examiner*—Kin-Chan Chen
(74) *Attorney, Agent, or Firm*—Thomas, Kayden, Horstemeyer & Risley

(57) ABSTRACT

A new method is provided for the processing of metals, most notably copper, such that damage to exposed surfaces of these metals is prevented. During a step of semiconductor processing, which results in exposing a metal surface to a wet substance having a pH value, a voltage is applied to the metal that is exposed. The value of the applied voltage can, dependent on the value of the pH constant of the wet substance, be selected such that the exposed metal surface is protected against alkaline effects of the wet substance.

20 Claims, 9 Drawing Sheets

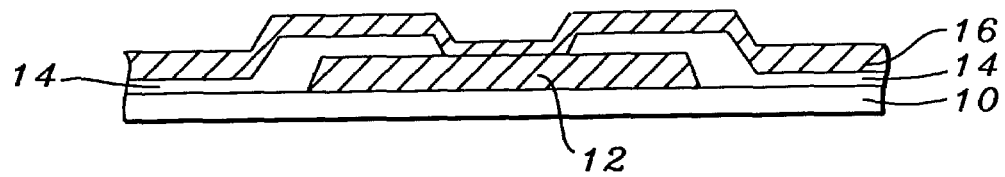
FIG. 1 — Prior Art
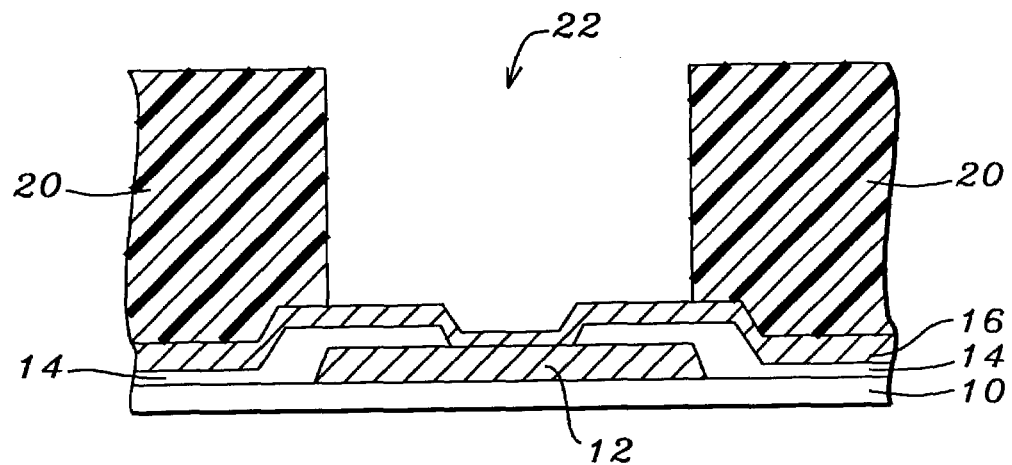
FIG. 2 — Prior Art
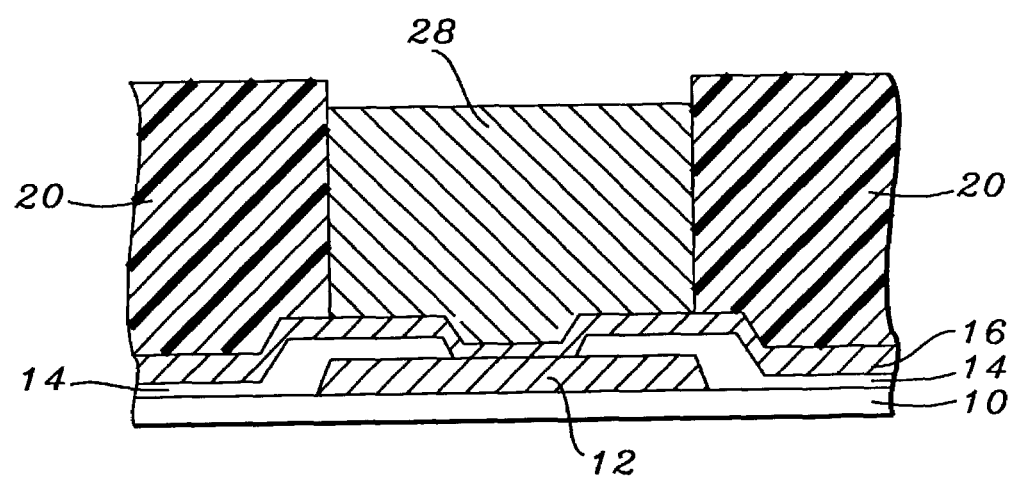
FIG. 3 — Prior Art

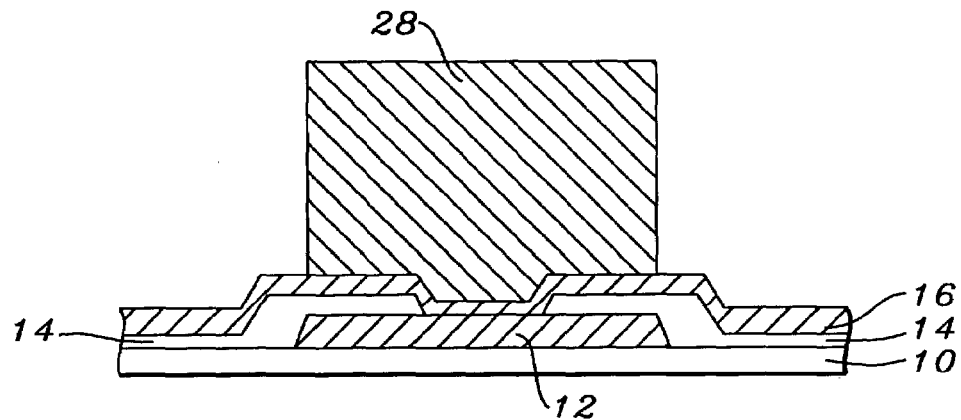
FIG. 4 – Prior Art
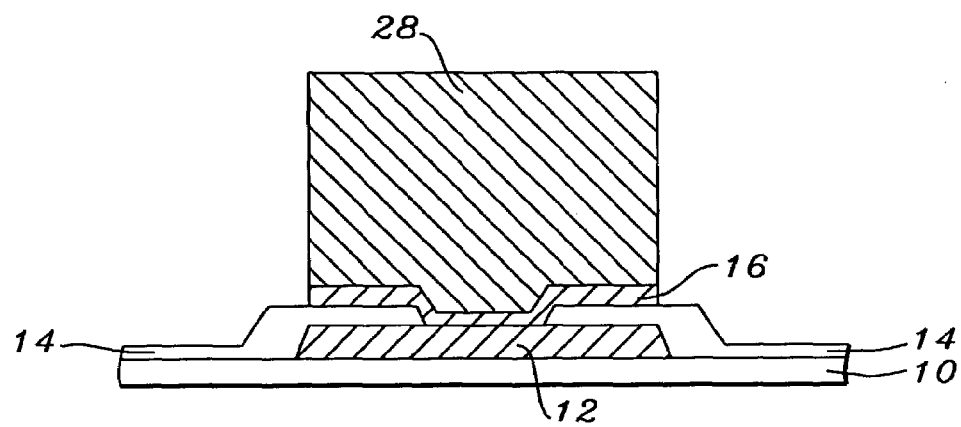
FIG. 5 – Prior Art
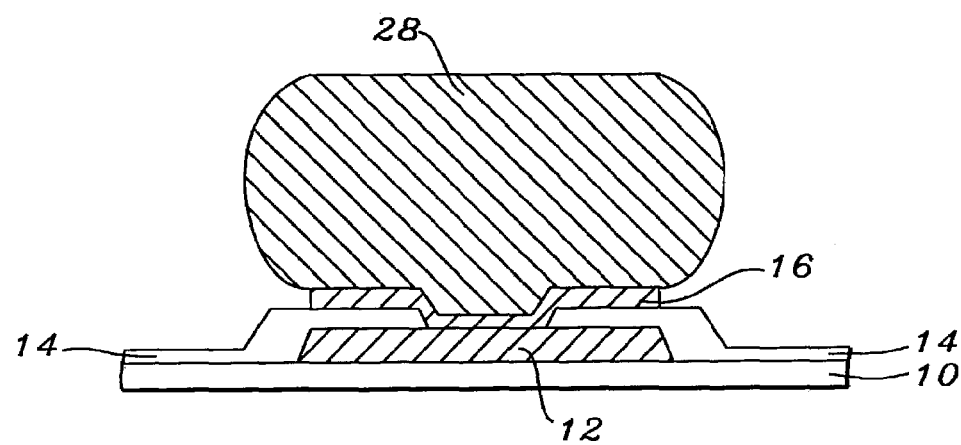
FIG. 6 – Prior Art

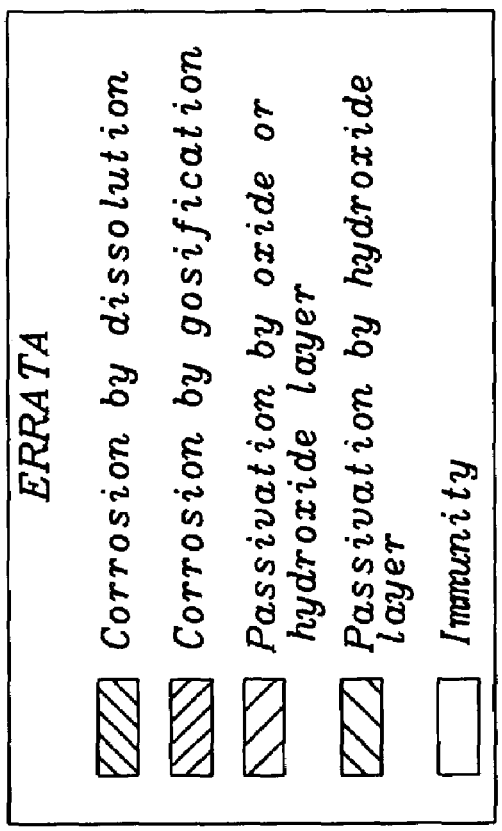
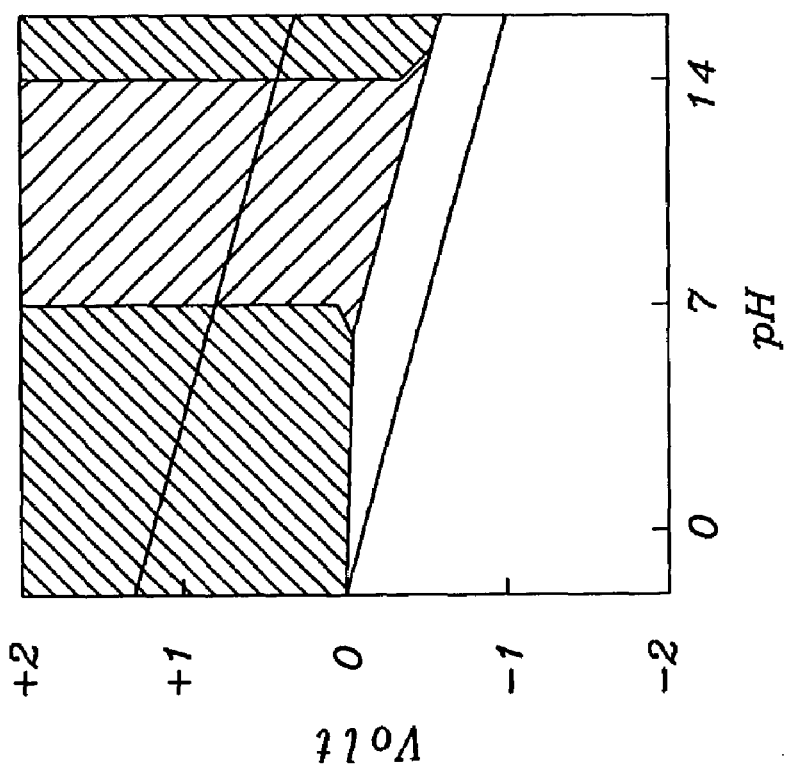
FIG. 7a

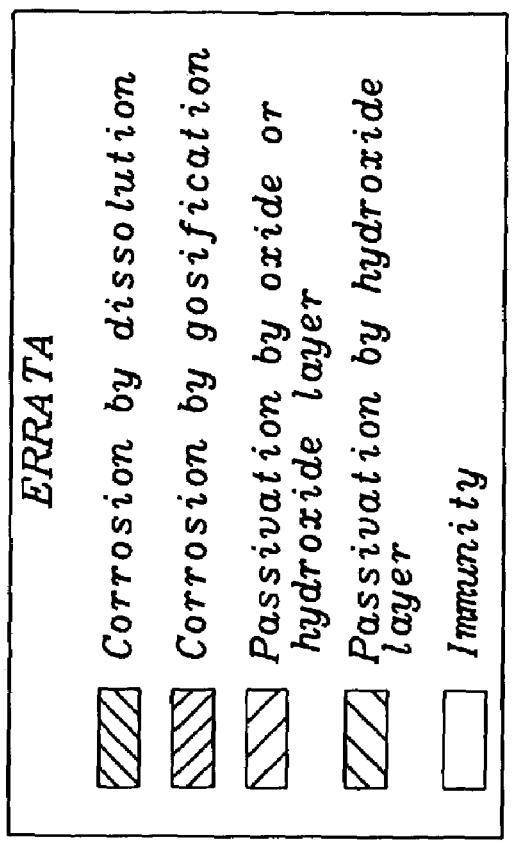
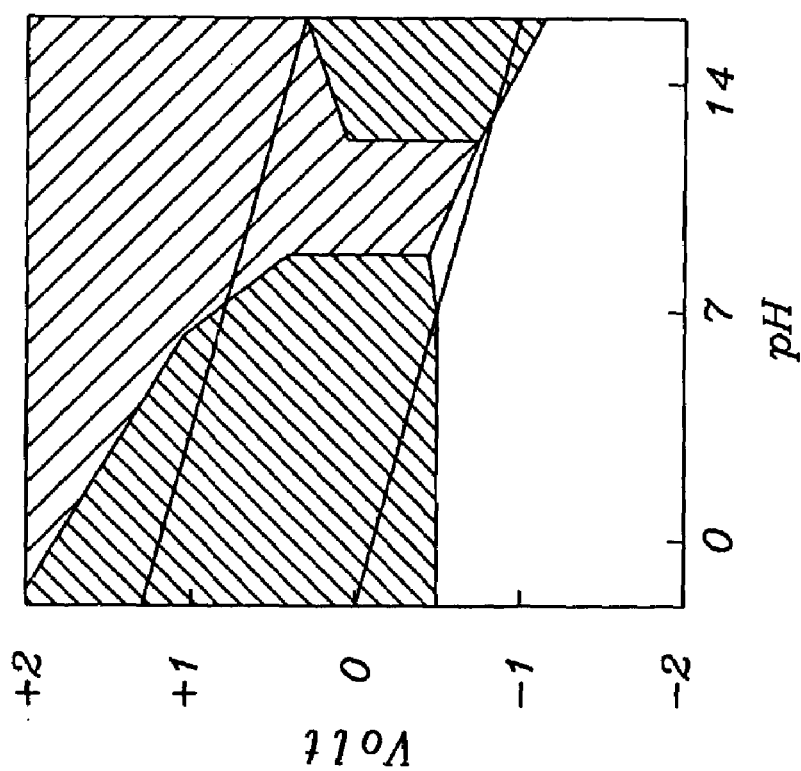
FIG. 7b

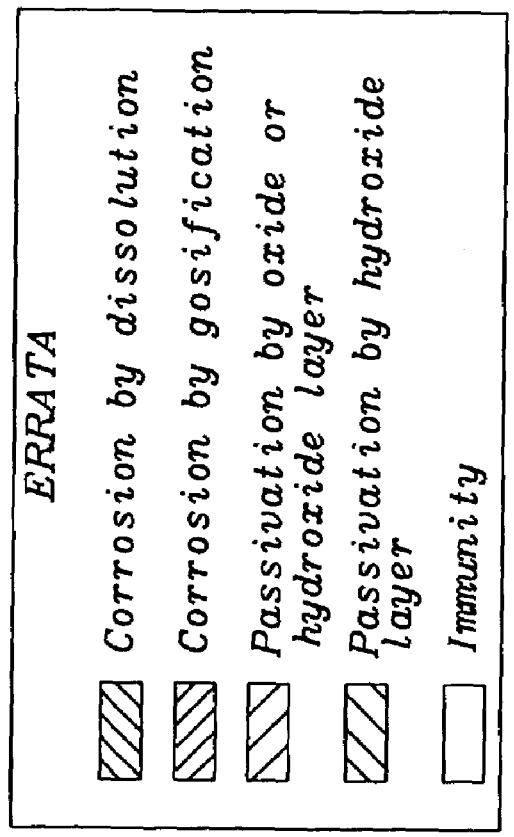
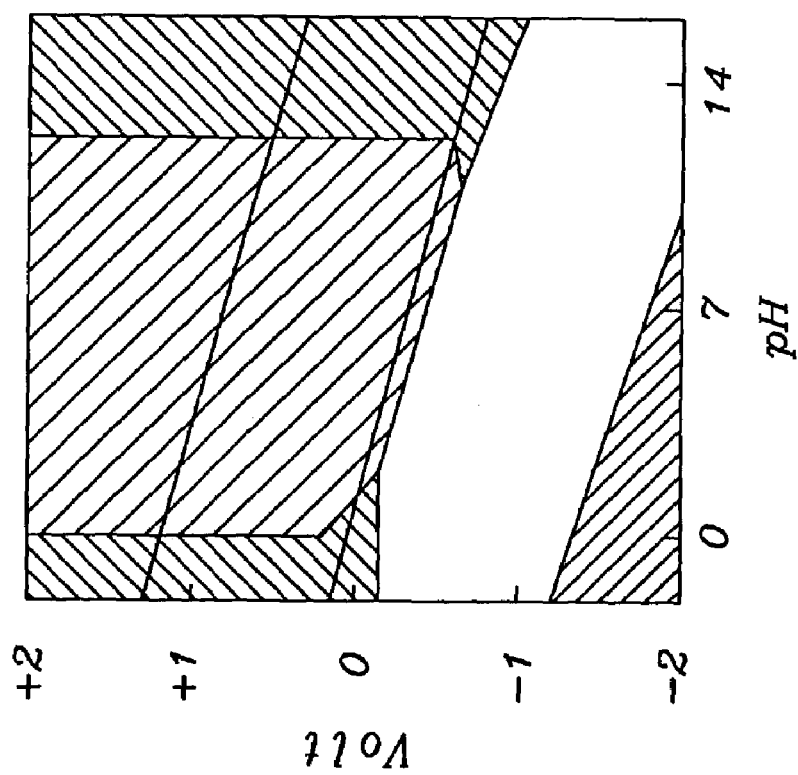
FIG. 7d

APPLICATION OF IMPRESSED-CURRENT CATHODIC PROTECTION TO PREVENT METAL CORROSION AND OXIDATION

BACKGROUND OF THE INVENTION (1) Field of the Invention

The invention relates to the fabrication of integrated circuit devices, and more particularly, to a method to prevent corrosion of copper.

(2) Description of the Prior Art

In the creation of semiconductor devices, device elements are interconnected with metal traces, as are completed devices, for the performance of complex processing functions. Conventionally, aluminum has been used for the creation of interconnect traces. With increased device density and continued demands for device performance improvements, a substitute for aluminum has been explored and is at this time being used by using copper for the creation of interconnect traces. Other materials that are useful for the creation of conductive interconnect traces are tungsten, titanium, polysilicon, polycide or alloys of these metals.

Copper is increasingly used for interconnect traces due to its relatively low cost and low resistivity. Copper however has a large diffusion coefficient into silicon dioxide and silicon. Copper from an interconnect may diffuse into surrounding dielectric such as a silicon dioxide layer, causing the dielectric to become conductive and decreasing the dielectric strength of for instance the silicon dioxide layer. Copper interconnects are therefore typically encapsulated by at least one diffusion barrier to prevent diffusion of the copper into the silicon dioxide layer. Silicon nitride is a diffusion barrier to copper, but the prior art teaches that the interconnects should not lie on a silicon nitride layer because it has a high dielectric constant compared with silicon dioxide. The high dielectric constant causes an undesired increase in capacitance between the interconnect and the substrate. Also, copper has low adhesive strength to various insulating layers, and presents difficulties inherent in masking and etching a blanket layer of copper into intricate circuit structures.

In practical applications of creating conductive interconnect traces, the metal layers of Integrated Circuit (IC) devices are prone to be corroded and oxidized by various chemicals that are used during the processing of the IC devices. For example, copper is corroded if it is exposed to a strong alkaline solution. The invention provides a structure of preventing this corrosion of copper, using the Pourbaix diagram of copper and therewith applying a method of impressed-current cathodic protection. A process will be highlighted that further explains the exposure that is suffered by copper that is used as part of the creation of an interconnect bump. The invention provides a structure of impressed-current cathodic protection to prevent corrosion of the metal that is used for the creation of for instance interconnect traces or interconnect studs or bumps.

U.S. Pat. No. 6,274,504 B2 (Sanderfer et al.) shows a process to minimize corroding during post metal solvent clean.

U.S. Pat. No. 6,209,551 B1 (Yang et al.) is a related strip process.

U.S. Pat. No. 5,336,371 (Chung et al.) shows a photoresist stripper tool that reduces corrosion.

The Pourbaix diagrams that are discussed as part of the invention are further detailed in the publication "Atlas of Electromechanical Equilibria in Aqueous Solution", published 1974, ISBN 0-915567-98-9.

SUMMARY OF THE INVENTION

A principle objective of the invention is to prevent corrosion of metal surfaces that are exposed to semiconductor chemicals during wet processing.

Another objective of the invention is to prevent oxidation of metal surfaces that are exposed to semiconductor chemicals during wet processing.

Another objective of the invention is to prevent the alignment mark being affected, that is damaged or discolored, by wet substance, thereby assuring that the alignment mark will remain effective as an alignment medium.

Another objective of the invention is to prevent the formation of by-products by a process of corrosion of exposed metal surfaces, eliminating the creation of etch residue during the etch of for instance a layer of seed metal.

In accordance with the objectives of the invention a new method is provided for the processing of metals, most notably copper, such that corrosion and oxidation of exposed surfaces of these metals is prevented. During a step of semiconductor processing, which results in exposing a metal surface to a wet substance having a pH value, a voltage is applied to the metal that is exposed. The value of the applied voltage can, dependent on the value of the pH constant of the wet substance, be selected such that the exposed metal surface is protected against alkaline effects of the wet substance.

BRIEF DESCRIPTION OF THE DRAWINGS

FIGS. 1 through 6 address prior art methods of forming a solder ball, as follows:

FIG. 1 shows a cross section of a semiconductor surface on which a contact pad has been provided, a layer of passivation has been deposited over the semiconductor surface and has been patterned and etched, exposing the surface of the aluminum pad. A seed layer has been blanket deposited.

FIG. 2 shows the cross section of FIG. 1 after a photoresist mask has been created.

FIG. 3 shows the cross section of FIG. 3 after the exposed surface of the seed layer has been electroplated with a layer of solder.

FIG. 4 shows a cross section after the photoresist mask has been removed.

FIG. 5 shows a cross section after the seed layer has been etched.

FIG. 6 shows a cross section after reflow of the solder material.

FIGS. 7a through 7d show Pourbaix diagrams for four metals.

DESCRIPTION OF THE PREFERRED EMBODIMENTS

Figure 7C:
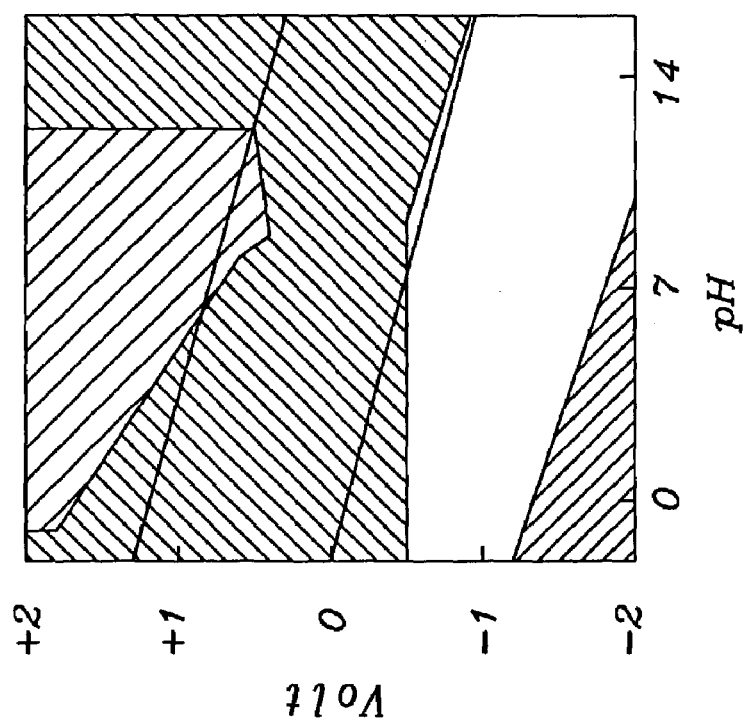

In order to place the invention in the proper perspective, a short overview of a metal processing sequence is first highlighted, the selected sequence is aimed at creating a solder bump or stud. The cross sections of FIGS. 1 through 6 are used for this purpose.

Referring now specifically to FIG. 1, there is shown a cross section of a semiconductor surface 10 on which:

a contact pad 12 has been provided; contact pad 12 preferably comprises aluminum or an aluminum alloy or copper a layer 14 of passivation has been deposited over the semiconductor surface 10 and has been patterned and etched partially exposing the surface of the aluminum pad 12 in-situ sputter clean (not shown) has been performed of the exposed surface of the contact pad, and a seed layer 16 has been blanket deposited over the surface of the layer 14 of passivation including the exposed surface of the contact pad 12.

Layer 10 is the surface of a semiconductor layer, a contact pad 12 has been created on surface 10. Surface 10 will typically be the surface of a semiconductor substrate, the surface of an interconnect substrate and the like. A contact pad 12 has been created on surface 10, electrical contact must be established with contact pad 12 by means of an overlying solder bump. Contact pad 12 serves as an interface between the solder bump and electrical interconnects that are provided in the surface of layer 10 and is typically created using aluminum or copper.

A layer 14 of passivation that may, for instance, contain Plasma Enhanced silicon nitride (PE $Si_3N_4$), is deposited over the surface of layer 10 and of contact pad 12.

Various materials have found application in the creation of passivation layers. A passivation layer can contain silicon oxide/silicon nitride ($SiO_2/Si_3N_4$) deposited by CVD, a passivation layer can be a layer of photosensitive polyimide or can comprise titanium nitride. Another material often used for a passivation layer is phosphorous doped silicon dioxide that is typically deposited over a final layer of aluminum interconnect using a Low Temperature CVD process. In recent years, photosensitive polyimide has frequently been used for the creation of passivation layers. Conventional polyimides have a number of attractive characteristics for their application in a semiconductor device structure, which have been highlighted above. Photosensitive polyimides have these same characteristics but can, in addition, be patterned like a photoresist mask and can, after patterning and etching, remain on the surface on which it has been deposited to serve as a passivation layer. Typically, and to improve surface adhesion and tension reduction, a precursor layer is first deposited by, for example, conventional photoresist spin coating. The precursor is, after a low temperature pre-bake, exposed, using for example a step and repeat projection aligner and Ultra Violet (UV) light as a light source. The portions of the precursor that have been exposed in this manner are cross-linked, thereby leaving unexposed regions (that are not cross-linked) over the bonding pads. During subsequent development, the unexposed polyimide precursor layer (over the bonding pads) is dissolved, thereby providing openings over the bonding pads. A final step of thermal curing leaves a permanent, high quality passivation layer of polyimide over the substrate.

The preferred material for the deposition of layer 14 of passivation is Plasma Enhanced silicon nitride (PE $Si_3N_4$), deposited using PECVD technology at a temperature between about 350 and 450 degrees C. with a pressure of between about 2.0 and 2.8 Torr for the duration between about 8 and 12 seconds. Layer 14 of PE $Si_3N_4$ can be deposited to a thickness between about 12 and 15 µm.

Layer 14 of PE $Si_3N_4$ is next patterned and etched to create an opening in the layer 14 that overlays and aligns with the underlying contact pad 12.

The etching of layer 14 can use $Ar/CF_4$ as an etchant at a temperature of between about 120 and 160 degrees C. and a pressure of between about 0.30 and 0.40 Torr for a time of between about 33 and 39 seconds using a dry etch process.

The etching of layer 14 can also use $He/NF_3$ as an etchant at a temperature of between about 80 and 100 degrees C. and a pressure of between about 1.20 and 1.30 Torr for a time of between about 20 and 30 seconds using a dry etch process.

For the in-situ sputter clean, a sputter ion-milling tool can be used, applying Ar mixed with $H_2$ as a cleaning agent (sputter source).

For the seed layer 16 that is blanket deposited over the surface of the layer 14 of passivation, including the exposed surface of the contact pad 12, any of the conventional metallic seed materials can be used, preferably comprising copper or chrome. The metallic seed layer can be deposited using a sputter chamber or an Ion Metal Plasma (IMP) chamber at a temperature of between about 0 and 300 degrees C. and a pressure of between about 1 and 100 mTorr, using (for instance) copper or a copper alloy as the source (as highlighted above) at a flow rate of between about 10 and 400 sccm and using argon as an ambient gas.

FIG. 2 shows the cross section of the semiconductor surface 10 after a layer 20 of photoresist has been deposited over the layer 16 Of seed material. Layer 20 of photoresist has been patterned and developed, creating opening 22 in the layer 20 of photoresist, exposing the surface of the layer 16 of seed material overlying the contact pad 12 where the interconnect bump is to be formed.

Layer 20 of photoresist can be deposited or laminated to a thickness of between about 2,000 and 8,000 Angstrom or between about 50 and 120 µm. The methods used for the deposition or lamination and development of the layer 20 of photoresist apply conventional methods of photolithography. Photolithography is a common approach wherein patterned layers are usually formed by spinning or by laminating on a layer of photoresist, projecting light through a photomask with the desired pattern onto the photoresist to expose the photoresist to the pattern, developing the photoresist, washing off the unexposed photoresist, and plasma etching to clean out the areas where the photoresist has been washed away. The exposed resist may be rendered insoluble (negative working) and form the pattern, or soluble (positive working) and be washed away.

The layer 20 of photoresist will, after patterning and developing, remain in place in an area above the aluminum pad 12 that surrounds the pad 12 and that is adjacent to the pad 12. The deposited layer 20 of photoresist can, prior to patterning and etching, be cured or pre-baked further hardening the surface of the layer of photoresist.

Layer 20 of photoresist can be etched by applying $O_2$ plasma and then wet stripping by using a $H_2SO_4$, $H_2O_2$ and $NH_4OH$ solution. Sulfuric acid ($H_2SO_4$) and mixtures of $H_2SO_4$ with other oxidizing agents such as hydrogen peroxide ($H_2O_2$) are widely used in stripping photoresist after the photoresist has been stripped by other means. Wafers to be stripped can be immersed in the mixture at a temperature between about 100 degrees C. and about 150 degrees C. for 5 to 10 minutes and then subjected to a thorough cleaning with deionized water and dried by dry nitrogen. Inorganic resist strippers, such as the sulfuric acid mixtures, are very effective in the residual free removal of highly postbaked resist. They are more effective than organic strippers and the longer the immersion time, the cleaner and more residue free wafer surface can be obtained.

The photoresist layer 20 can also be partially removed using plasma oxygen ashing and careful wet clean. The oxygen plasma ashing is heating the photoresist in a highly oxidized environment, such as an oxygen plasma, thereby converting the photoresist to an easily removed ash. The oxygen plasma ashing can be followed by a native oxide dip for 90 seconds in a 200:1 diluted solution of hydrofluoric acid.

Layer 20 of photoresist can additionally be cured after the layer of photoresist has been deposited and before the layer of photoresist is patterned and developed. This curing of the layer of photoresist can be performed in a $N_2$ gas ambient, at a temperature of between about 300 and 400 degrees C., for a time period between about 1.5 and 2.5 hours, and a pressure of 760 Torr.

FIG. 3 shows a cross section of the semiconductor surface 10 after the exposed surface of layer 16 of seed metal, that is surface of layer 16 of seed metal that is exposed inside opening 22, has been electro plated with layer 28 of solder. Layer 28 is bounded by the etched layer 20 of photoresist. During the process of the electroplating, the layer 16 of seed metal serves as the cathode of the plating tool. Metal layer 28, FIG. 3, can be used as a bump, in which case bump metal comprising Pb or Sn is preferably used. Layer 28 can also be used as a re-route trace in which case Al or Cu alloy is preferably used for the creation of layer 28.

The layer 28 of bump or re-route metal is electroplated in contact with the layer 16, to a thickness of between about 30 and 100 µm but more preferably to a thickness of about 50 µm.

FIG. 4 shows the cross section of the semiconductor surface after the patterned layer 20 of photoresist has been stripped from the surface of the layer 16 of seed metal. The previously highlighted processing conditions for the removal of photoresist can be equally applied to the stripping of the photoresist that is shown in FIG. 4, these conditions therefore do not need to be further highlighted at this time.

FIG. 5 shows a cross section of the semiconductor surface 10 after the layer 16 (of seed material) has been etched using the created layer 28 of solder as a mask. Standard RIE procedures, using $Cl_2$—$BCl_3$ as etchant, can be used to etch the layer 16 of seed metal.

FIG. 6 shows, as a final figure of the highlighted prior art processing sequence, the creation of solder ball 28 after the patterned layer 28 of solder that is shown in cross section in FIG. 5 has been submitted to reflow by applying heat to the structure. For this processing step, a flux is applied to the solder layer 28 and the solder is melted in a reflow surface under a nitrogen atmosphere, forming the spherically shaped solder bump 28 that is shown in cross section in FIG. 6.

As previously stated relating to the cross sections of FIGS. 1 through 6, seed metal 16 is preferably Cu or Cr, bump metal 28 is preferably Pb or Sn, re-route traces 28 preferably uses Al or Cu. The stripper that is used for the removal of the photoresist mask 20, FIG. 3, is typically strongly alkaline with a pH value between about 12 and 16.

Conventional problems that are encountered due to the interface between the photoresist striper and the thereby exposed surface of the seed layer are:

1. the stripper of strong alkaline nature corrodes the surface of the layer 16 of seed metal, and
2. the strong alkaline stripper discolors and damages the substrate alignment mark.

As a result of the first of these negative effects, the corrosion of the surface of the layer 16 of seed metal, a by-product consisting of metal oxide is formed over the surface of the layer 16 of seed metal. This layer of metal oxide blocks etching of the layer 16 of seed metal and further introduces a metal-oxide based etching residue.

As a result of the second of these negative effects, the discoloring and damaging of the alignment mark of the wafer, the alignment mark (in its use by for instance a stepper tool) is less effective due to its loss of visibility.

The invention addresses these problems providing a method that is referred to as an impressed-current cathodic protection structure. The basic idea of the invention is to apply, during steps of wet processing, a negative voltage to metal that has been created over the surface of a wafer, in this manner preventing the corrosion of the surface of the metal such as for instance the surface of a layer of copper.

Pourbaix diagrams show the stability of a first material, such as copper, under conditions of applying a voltage or potential to the first material, while the first material is exposed to a second, liquid material such as water or a substance of a (known and potentially high) alkaline nature. In a Pourbaix diagram, which typically has an X-axis that represents the pH factor of the second material and an Y-axis that represents the voltage that is applied to the first material, areas are identified that show the surface condition of the first material (for instance Cu), dependent on the pH factor of the second material (for instance photoresist) and the voltage that is applied to the first material.

Conditions of the surface of the first material (such as copper) that are shown in the Pourbaix diagram can be differentiated as:
1. corrosion by dissolution
2. corrosion by gasification
3. passivation by the formation of an oxide or a hydroxide layer
4. passivation by a hydroxide layer, and
5. no effect, that is immunity of the surface (of the first material) to the pH value of the second material under certain conditions of voltage application to the first material.

It is from this classification clear that the last condition, that is the condition of "no effect", is the desirable condition since under this condition the surface of the first material, such as copper, is not effected by the pH constant of the second material. The establishment of this desirable (condition number 5) can be accomplished by applying, for a metal such as copper that comes into contact with a liquid having a pH value, a voltage of a selected value.

For instance, using the Porbaix diagram of FIG. 7a, which relates to copper, by applying a voltage of about −1 volt to the copper while the copper is exposed to a wet solution having a pH value of 14, the surface of the copper will not be affected by (will be immune to) the alkaline nature of the wet solution.

These effects and interrelationships have been graphically highlighted in the diagrams that are shown in FIGS. 7a through 7d. The errata that are indicated as part of FIGS. 7a through 7d further refer to and explain the above listed surface conditions (of the first material), whereby the four diagrams that are shown in FIGS. 7a through 7d apply to:

diagram FIG. 7a: copper
diagram FIG. 7b: nickel
diagram FIG. 7c: lead
diagram FIG. 7d: tin.

For all of these diagrams there is a definite area, bounded by X coordinates (the pH value of the second material) and Y coordinates (the value of the voltage that is applied to the identified material such as copper, nickel.

Keeping the diagrams that have been shown in FIGS. 7a through 7d in mind, the following will become apparent as it applies to the process that is shown in FIGS. 1 through 6, that is a process where the surface of a layer of metal (seed metal in the example shown) is exposed to a wet process applying (for instance a photoresist stripper) a solution having a pH constant.

For product rework processing, the following applies:
1. During the processing sequence that is shown in FIGS. 1 through 6, whereby these FIGS. 1 through 6 are used merely as examples that can be further extended to and are meant to represent any process where a metal comes into contact with material having a pH constant that has an effect on the surface of the exposed metal, the metal that is exposed is seed metal
2. In applications where copper is exposed to a wet substance having a pH factor (in the range from 1 to 14), applying a negative voltage of −1.2 volts to the exposed copper, diagram of FIG. 7a, keeps the exposed copper immune for the effect that the wet substrate has on the surface of the exposed copper
3. FIG. 7a, for copper, further shows that for a wet substance that has a pH value of 16, a value applied to the exposed copper of about −0.6 prevents corrosion of the copper surface, and
4. After the processing step of photoresist stripping as shown in cross section in FIG. 4, the substrate that is being processed is typically rinsed by immersion of the substrate into DIW.

Residue that resides on the surface of the substrate, having a pH value, will thereby enter into the DIW and will consequently increase the pH value of the DIW. For a value of pH of the DIW of between about 9 and 13, a voltage of about −0.4 volts or less must be applied to the copper in order for the copper surface to remain immune to effects of the alkaline nature of the DIW.

For photoresist stripping, the following applies:
1. The metals that are exposed to an alkaline solution are seed metal and bump metal, which typically comprises Cu seed metal and Pb/Sn alloy bump metal
2. For a pH value of the photoresist stripper between about 15 and 16, a voltage between about −1.2 and 2.0 volts must be applied to the metal layer
3. For a pH value of the photoresist stripper between about 7 and 11, a voltage between about −1.2 and −1.4 volts must be applied to the metal layer
4. For the above indicated ranges of the applied voltages, the following phenomenon is in effect: the applied voltage to the metal is limited to between −1.2 volts and −2.0 volts in the two ranges of pH values since the exposed Sn of the metal layers will form gaseous hybride if the applied voltages exceed the indicated values for the stated values of pH; gaseous hybride has a detrimental effect on other layers of metal, such as the solder bumps that are created as part of a processing cycle
5. Other metals that are known to form gaseous hybride under conditions of relatively large applied negative voltages and dependent on the pH value of the material to which these metals are exposed are In, Pb, Sb, Po, B As, Ti and Ge.

From the above it is clear that, by applying a voltage, typically of negative value, to a metal surface that is exposed to a wet substance having a pH value and dependent on the metal and the value of the pH value, the results can be achieved of:
1. Not corroding the surface of the exposed metal, even for exposures where the wet substance has a relatively high value of pH
2. Not affecting the surface of the alignment mark, that is the surface of the alignment mark will not be damaged or discolored, by the wet substance and will therefore remain effective as an alignment medium, and
3. Not forming and by-products by a process of corrosion of the exposed metal surface, eliminating the creation of etch residue during the etch of for instance a layer of seed metal.

Following, using FIGS. 8 through 11, will be highlighted examples of methods that can be applied for the implementation of the invention.

Figure 8:
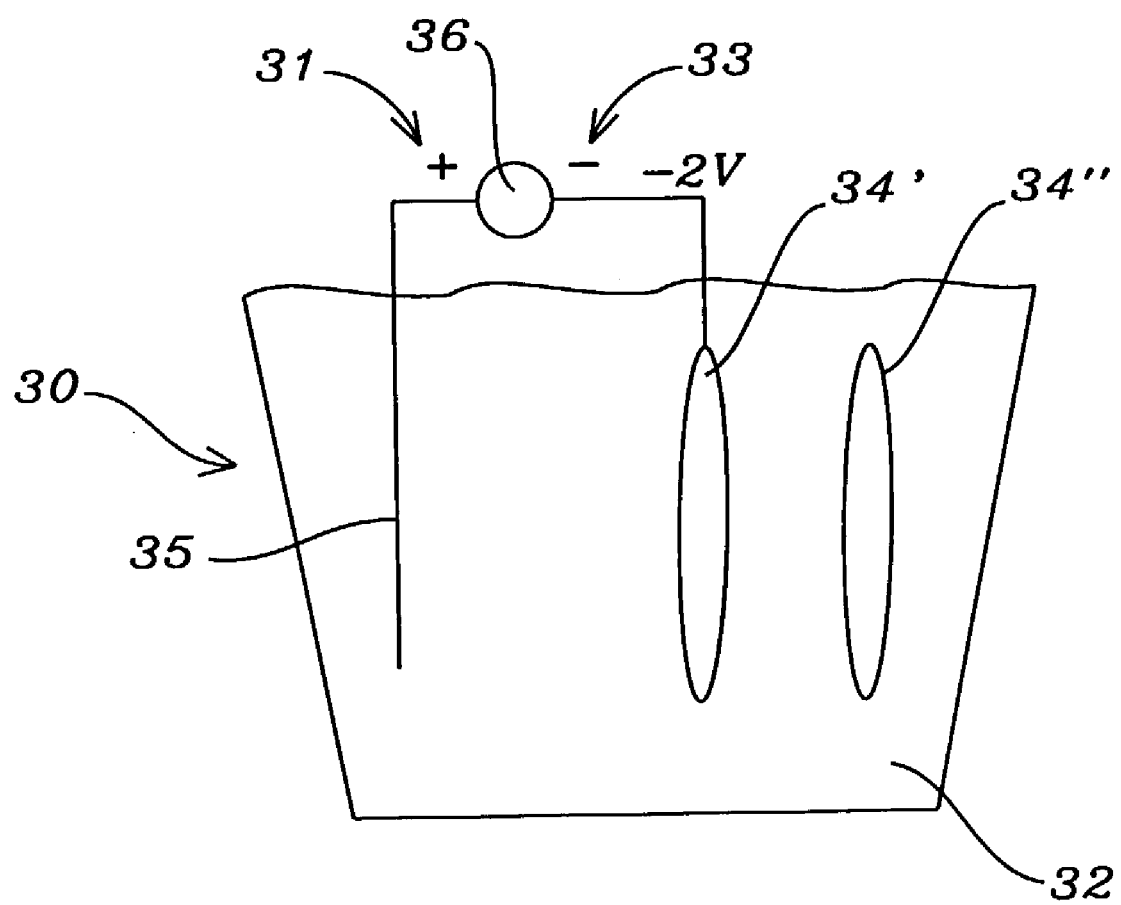
FIG. 8 shows a cross section of a voltage being applied to one or more wafers while these wafers are immersed in a fluid.

Shown in FIG. 8 is a simplified cross section of a reservoir 30 in which a liquid substance 32 such as DIW is contained. Wafers 34' and 34" have been suspended in a vertical position in the DIW that is contained in reservoir 30. One of the wafers, that is wafer 34', has been connected to a negative terminal 33 of voltage supply 36 of which a positive terminal 31 is inserted into the liquid substance 32. It can from the cross section that is shown in FIG. 8 be concluded that there is a negative voltage applied between the terminal 35, where this terminal has been inserted into the reservoir 30 and the facing wafer 34'.

This arrangement, as shown in simplified form in the cross section of FIG. 8, has been used to determine the effect of the pH value on the surface of wafer 34', as follows:
1. First the wafers 34' and 34" have been emerged into a chemical, contained in reservoir 30, having a pH in excess of 15.96 (a chemical known by the name of THB-S2). With an applied voltage of −2 volts, applied as shown in the cross section of FIG. 8, the wafer has first been inserted into the reservoir 32 with the reservoir containing THB-S2 after which the wafer has been dipped into a reservoir containing DIW. From this study it has been concluded that, with an applied voltage 33 of −2 volts, no effects of corrosion can be observed on the surface of wafer 34'
2. The above indicated experiment has been repeated, (first dipping the wafer into THB-S2 after which the wafer is dipped into a DIW containing reservoir), in this instance however applying a voltage 33 of 0 volts, applied to wafer 34'. In this case, severe corrosion in the form of stains has been observed in the surface of wafer 34' after the wafer has been immersed into the DIW as shown in FIG. 8.

From the above highlighted experiments, it can be concluded that the voltage (33) that is applied to a surface over which a layer of copper has been created has an effect on the amount of corrosion that occurs in this surface during exposure to liquids having pH values.

Figure 9A:
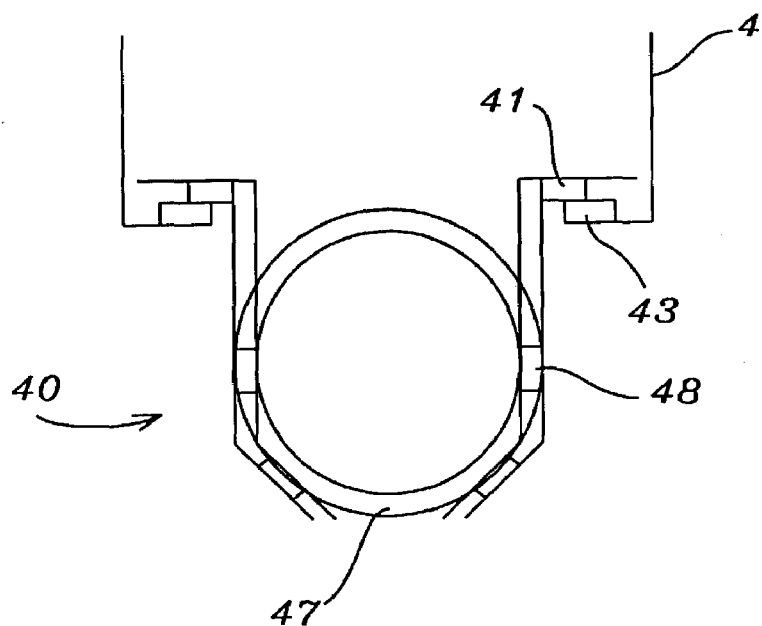
FIGS. 9a through 11 show three possible implementations of a structure for applying a voltage to a metallic layer.
Figure 9B:
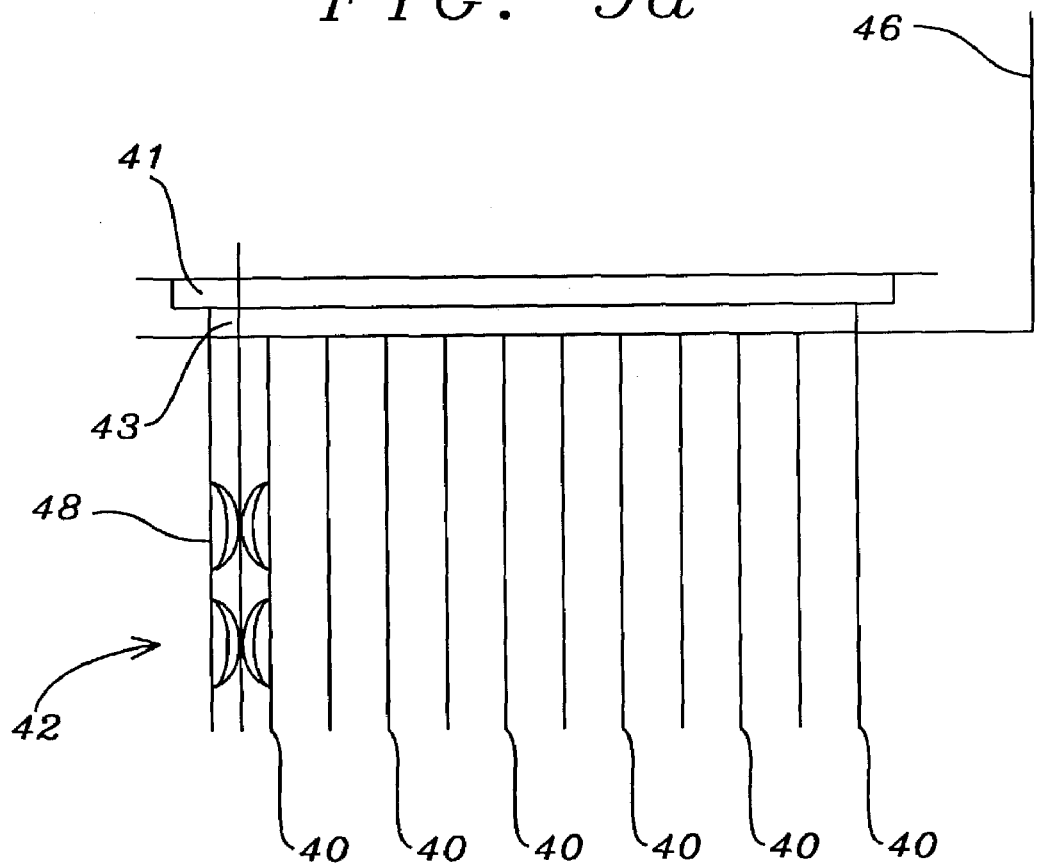

FIGS. 9a through 11 show three possible implementations of a structure for applying a voltage to a metallic layer, as follows:

FIGS. 9a and 9b show wafers 40, suspended in wafer cassette 42, being suspended in cassette 42 by a cassette carrier arrangement 46 in which 43 is a lower cassette support and 41 is an upper cassette support. The wafers 40 are contacted and firmly secured inside the cassette 42 by metal foils 48. The metal foils 48 contact the wafers 40 in the perimeter 47 of wafer 40, as is clear from the top view that is shown in FIG. 9a of wafer 40. Using the same perimeter 47, the wafers 40 are clamped in the lower cassette support 43, as is clear from the cross section of the cassette, containing multiple wafers 40. Wafers 40 are wafers that are typically referred to as etch-exclusion-wafers for reasons that are obvious in considering the presence of perimeter of edge 47. This perimeter of wafers 40 is not used for the creation of active semiconductor devices over the surface thereof.

FIGS. 9a and 9b have been shown in order to demonstrate one possible method of suspending wafers during the application of a negative voltage to the surface of a metal layer that is created over the surface of the wafers. More details relating to the application of a (preferably negative) voltage to a metal layer created over the surface of a wafer are shown in FIGS. 10a and 10b, where is shown:

- 40, a wafer that is clamped in wafer clamping device 50
- 50, the wafer clamping device
- 52, brackets in the wafer clamping device 50 that support and position wafer 40 within the wafer clamping device 50
- 60, an enlarged view of the structure to contact for instance a seed layer that has been created over the surface of wafer 40
- 54, the seed layer, similar to layer 16 of FIG. 1 e.a., that has been created over the surface of wafer 40
- 56, the layer of photoresist, similar to layer 20 of FIGS. 2 and 3, overlying the seed layer 54
- 58, a contact that conductively interfaces with the seed layer 54.

Figure 10A:
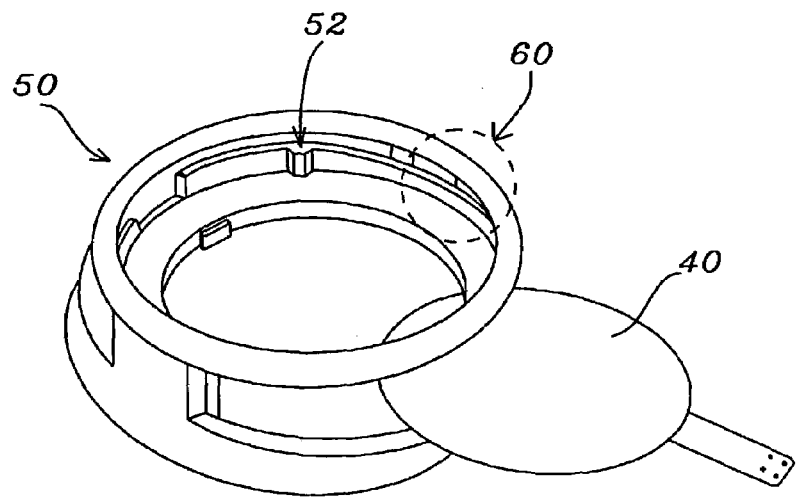
Figure 10B:
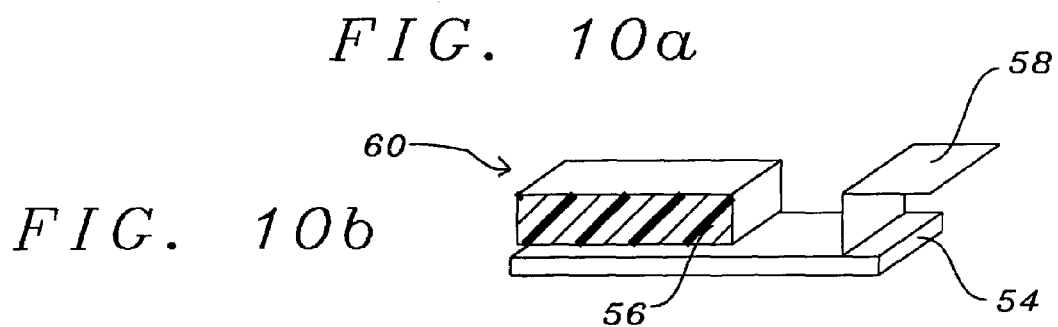

The design that is shown in three dimensional view in FIGS. 10a and 10b strongly resemble the design of an electroplating machine. With the implementation of feature 60, FIG. 10a, as detailed above, the design of an electroplating machine can be modified and applied meeting the objective of the instant invention for the process of stripping layer 56 of photoresist. The voltage that is to be applied to the layer of metal, for instance the seed layer 54 of FIG. 10b, is applied to the seed contact 58 of FIG. 10b. The layer 56 of photoresist is then stripped.

Figure 11:
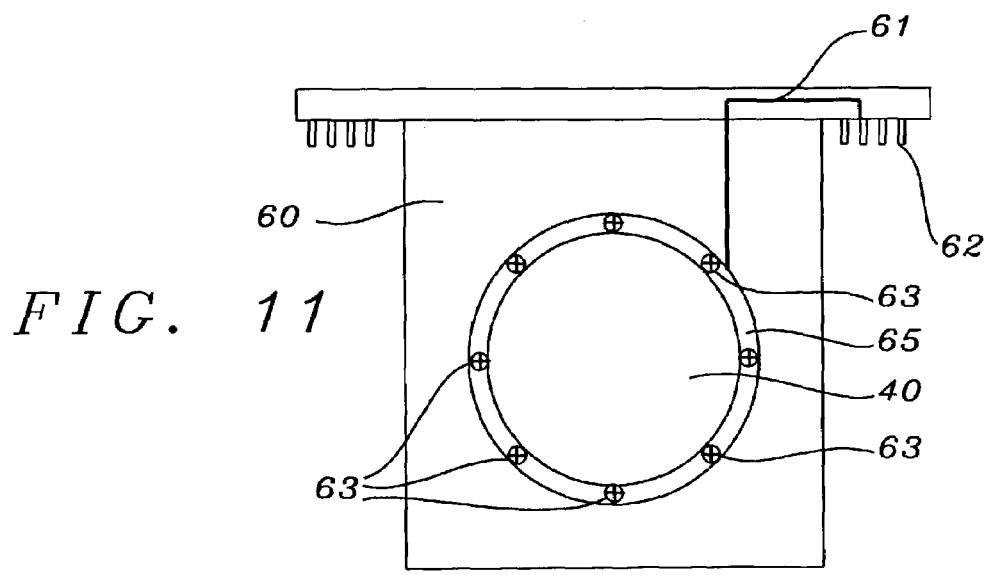

Shown in FIG. 11 is a top view of a mounting of one single wafer for purpose of applying a negative voltage to a layer of metal prior to the process of for instance photoresist stripping. The element 60 is the wafer carrier with a wafer 40 being contained therein. Wafer 40 has again a perimeter, highlighted as perimeter 65, over this perimeter 65 are provided pins 63 for contacting the metal layer created over the surface of wafer 40. Conductive interconnect 61 provides a voltage to the contact pins 63, this voltage is supplied to conductive interconnect by means of terminals 62.

To summarize, the invention provides for considering and effectively using:

1. The impact that chemical substances, having a pH value, have on metal surfaces that are processed while coming in contact with these chemical substances
2. Applying a voltage to metal surfaces during the time that these metal surfaces come into contact with chemical substances
3. Assuring that metal surfaces that come into contact with chemical substances are processed such that the corrosive impact of these chemical substances on the exposed metal surfaces is eliminated
4. Preventing that the alignment mark is affected by a chemical substance, thereby assuring that the alignment mark will remain effective as an alignment medium, and
5. Preventing the formation of by-products by a process of corrosion of the exposed metal surface, eliminating the creation of etch residue during the etch of for instance a layer of seed metal.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method of preventing damage to a layer of metal in a semiconductor process, comprising:
    providing a semiconductor substrate, with a layer of metal;
    performing a semiconductor process on the semiconductor substrate, wherein the semiconductor process brings the surface of the layer of the metal in contact with a liquid solution capable of causing corrosion or oxidation thereof;
    providing a voltage supply device having a cathode and an anode; and
    applying a voltage to the layer of metal, wherein the cathode of the voltage supply device is electrically connected to the layer of metal and the anode of the voltage supply device is inserted into the liquid solution, such that the liquid solution is unable to corrode and oxidize the layer of metal.

2. The method of claim 1, said layer of metal comprising copper.

3. The method of claim 2, said voltage being of a negative value in the range between about −1.2 and −1.4 volts.

4. The method of claim 2, said liquid solution having a pH value being between about 7 and 11.

5. The method of claim 4, said liquid solution comprising a photoresist stripper.

6. The method of claim 1, said voltage being of a negative value in the range between about −1.2 and −1.4 volts.

7. The method of claim 1, said liquid solution having a pH value being between about 7 and 11.

8. The method of claim 7, said liquid solution comprising a photoresist stripper.

9. A method of preventing corrosion and oxidation of the surface of a layer of copper at a time that the layer of copper comes in contact with a photoresist snipper, comprising:
    providing a semiconductor surface, said semiconductor surface having been provided with a layer of copper over the surface thereof;
    providing a voltage supply device having a cathode and an anode; and
    applying a voltage to the surface of said layer of copper while bringing the surface of said layer of copper in contact with a photoresist stripper, wherein the cathode of the voltage supply device is electrically connected to the layer of copper and the anode of the voltage supply device is inserted into the photoresist stripper.

10. The method of claim 9, said semiconductor surface comprising the surface of a substrate.

11. The method of claim 9, said voltage being of a negative value in the range between about −1.2 and −1.4 volts.

12. The method of claim 9, said photoresist stripper having a pH value being between about 7 and 11.

13. A method of preventing damage or discoloration to the surface of an alignment mark, comprising:
    providing a semiconductor surface, said semiconductor surface having been provided with an alignment mark over the surface thereof, said semiconductor surface further having been provided with a layer of metal over the surface thereof;
    coating a layer of photoresist over the surface of said layer of metal;
    patterning said layer of photoresist, selectively converting said photoresist to a removable substance when brought into contact with a photoresist stripper;
    providing a voltage supply device having a cathode and an anode; and applying a voltage to the surface of said layer of metal while developing said layer of photoresist by removing said selectively converted photoresist by bringing said patterned layer of photoresist in contact with said photoresist stripper, wherein the cathode of the voltage supply device is electrically connected to the layer of metal and the anode of the voltage supply device is inserted into the photoresist stripper.

14. The method of claim 13, said semiconductor surface comprising the surface of a substrate.

15. The method of claim 13, said layer of metal comprising copper.

16. The method of claim 15, said semiconductor surface comprising the surface of a substrate.

17. The method of claim 15, said voltage being of a negative value in the range between about −1.2 and −1.4 volts.

18. The method of claim 15, said pH value being between about 7 and 11.

19. The method of claim 13, said voltage being of a negative value in the range between about −1.2 and −1.4 volts.

20. The method of claim 13, said photoresist stripper having a pH value being between about 7 and 11.

* * * * *